(12) United States Patent
Miyakawa et al.

(10) Patent No.: US 7,990,791 B2
(45) Date of Patent: Aug. 2, 2011

(54) SEMICONDUCTOR MEMORY DEVICE (75) Inventors: Tadashi Miyakawa, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 143 days.

(21) Appl. No.: 12/506,815

(22) Filed: Jul. 21, 2009

(65) Prior Publication Data
US 2010/0020627 A1    Jan. 28, 2010

(30) Foreign Application Priority Data
Jul. 23, 2008   (JP) ................................. 2008-189322

(51) Int. Cl.
G11C 7/02   (2006.01)
G11C 7/00   (2006.01)

(52) U.S. Cl. ..................................... 365/207; 365/233.1

(58) Field of Classification Search .................. 365/207, 365/205, 233.1
See application file for complete search history.

(56) References Cited

U.S. PATENT DOCUMENTS

| | | | |
|---|---|---|---|
| 5,657,269 A * | 8/1997 | Nanamiya | ................. 365/185.17 |
| 5,761,125 A | 6/1998 | Himeno | |
| 5,903,492 A | 5/1999 | Takashima | |
| 6,026,034 A * | 2/2000 | Suzuki et al. | ................. 365/190 |
| 6,418,057 B1 * | 7/2002 | Hosogane | ................ 365/185.21 |

FOREIGN PATENT DOCUMENTS

JP    2000-173300    6/2000

* cited by examiner

*Primary Examiner* — Anh Phung
(74) *Attorney, Agent, or Firm* — Oblon, Spivak, McClelland, Maier & Neustadt, L.L.P.

(57) ABSTRACT

A memory includes a cell array; bit lines; word lines; sense amplifiers; first determination transistors receiving information data and making a connection between a first voltage source and a first determination node be in a conductive or a non-conductive state based on a logic value of the information data; second determination transistors receiving the information data detected by the sense amplifiers and making a connection between the first voltage source and a second determination node be in a conductive or a non-conductive state based on the logic value of the information data; a second voltage source charging the first and the second determination nodes; and a determination unit detecting potentials of the first determination node and the second determination node when a logic of the information data is inverted logically to determine maximum and minimum values of potential of the information data.

9 Claims, 10 Drawing Sheets

SEMICONDUCTOR MEMORY DEVICE

CROSS-REFERENCE TO RELATED APPLICATION

This application is based upon and claims the benefit of priority from the prior Japanese Patent Applications No. 2008-189322, filed on Jul. 23, 2008, the entire contents of which are incorporated herein by reference.

BACKGROUND OF THE INVENTION

1. Field of the Invention

This invention relates to a semiconductor memory device.

2. Related Art

In development and mass production of memories, the signal difference between memory cells storing data "0" (hereinafter, "0 cells") and memory cells storing data "1" (hereinafter, "1 cells") is an important parameter. For example, a reference voltage required for detecting data in memory cells is set to the intermediate potential between the potential of the data "0" and the potential of the data "1". At this time, it is assumed that the detected voltage for 0 cells is lower than the one for 1 cells. In this case, the reference voltage is set based on the maximum value in voltage distribution of 0 cells' data and the minimum value in voltage distribution of 1 cells' data. Accordingly, the maximum voltage for 0 cells' data and the minimum voltage for 1 cells' data are also important parameters.

To measure the maximum voltage for 0 cells' data and the minimum voltage for 1 cells' data, there has been the following measurement process for conventional memories. A certain voltage is set as a reference voltage and data detection (read) is performed for all cells while changing their addresses to output the resultant data. The reference voltage is then changed by a step voltage, and the data detection and output are repeated. Based on the data outputted from output circuits, the voltage distribution of the data "0" and the voltage distribution of the data "1" are obtained. The maximum value for 0 cell and the minimum value for 1 cell are obtained from these voltage distributions and the reference voltage is determined based on the maximum value and the minimum value. Such processes for conventional memories require a considerably long time to determine the reference voltage.

SUMMARY OF THE INVENTION

A semiconductor memory device according to an embodiment of the present invention comprises: a memory cell array comprising a plurality of memory cells arranged in a matrix; a plurality of bit lines connected to memory cells arranged in a first direction in the memory cell array; a plurality of word lines connected to the memory cells arranged in a second direction crossing the first direction in the memory cell array; a plurality of sense amplifiers detecting information data on the basis of reference data transmitted to a second bit line, the information data being transmitted to a first bit line among the bit lines; a plurality of first determination transistors receiving information data detected by the sense amplifiers at their gates and making a connection between a first voltage source and a first determination node be in a conductive state or a non-conductive state on the basis of a logic value of the information data; a plurality of second determination transistors receiving the information data detected by the sense amplifiers at their gates and making a connection between the first voltage source and a second determination node be in a conductive state or a non-conductive state on the basis of the logic value of the information data; a second voltage source charging the first and the second determination nodes; and a determination unit connected to the first and the second determination nodes and detecting potentials of the first determination node and the second determination node when a logic of the information data detected by the sense amplifiers is inverted from a first logic to a second logic or from the second logic to the first logic in order to determine maximum and minimum values of potential of the information data stored in the memory cells.

A semiconductor memory device according to an embodiment of the present invention comprises: a memory cell array comprising a plurality of memory cells arranged in a matrix; a plurality of bit lines connected to memory cells arranged in a first direction in the memory cell array; a plurality of word lines connected to the memory cells arranged in a second direction crossing the first direction in the memory cell array; a plurality of sense amplifiers detecting information data on the basis of reference data transmitted to a second bit line, the information data being transmitted to a first bit line among the bit lines; an output node transmitting information data detected by the sense amplifiers; an output unit connected to the output node and outputting the information data externally from the semiconductor memory device; and a counter connected to the output node and receiving the information data when a certain potential is used as the reference data for each of the sense amplifiers, the counter counting number of information data whose logic is inverted from a first logic to a second logic or from the second logic to the first logic in order to determine distribution of potential of the information data stored in the memory cells.

DETAILED DESCRIPTION OF THE INVENTION

Embodiments of the present invention will be explained below in detail with reference to the accompanying drawings. Note that the invention is not limited thereto.

First Embodiment

Figure 1:
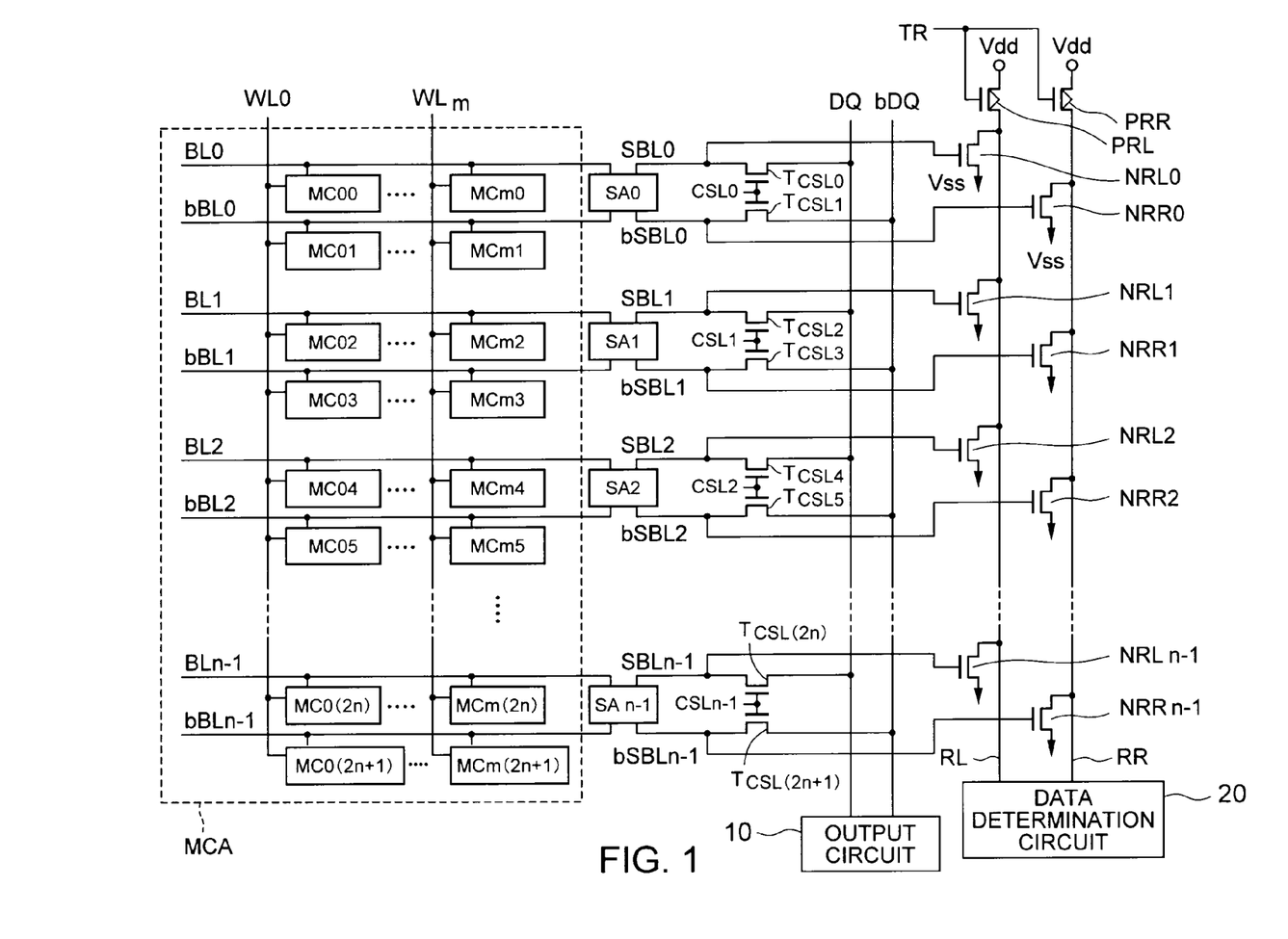
FIG. 1 is a block diagram of configuration of a memory device according to a first embodiment of the present invention.

FIG. 1 is a block diagram of configuration of a memory device according to a first embodiment of the present invention. The memory device according to the first embodiment can be any memories that store digital values serving as information data in memory cells and make a sense amplifier detect the information data based on reference data. For example, the memory device can be a DRAM, flash memory, ferroelectric memory, MRAM (Magneto resistive RAM), PRAM (Phase-change RAM), or FBC (Floating Body Cell) memory.

The memory device includes a memory cell array MCA, bit lines BL0 to BLn−1, bBL0 to bBLn−1 (hereinafter, simply BL), word lines WL0 to WLm (hereinafter, simply WL), sense amplifiers SA0 to SAn−1 (hereinafter, simply SA), sense nodes SBL0 to SBLn−1, bSBL0 to bSBLn−1 (hereinafter, simply SBL), column selective lines CSL0 to CSLn−1 (hereinafter, simply CSL), DQ lines DQ and bDQ, N-type transistors NRL0 to NRLn−1 serving as first determination transistors, N-type transistors NRR0 to NRRn−1 serving as second determination transistors, a node RL serving as a first determination node, a node RR serving as a second determination node, an output circuit 10, a data determination circuit 20 serving as a determination unit, a first power supply Vss, and a second voltage source Vdd.

The memory cell array MCA includes a plurality of memory cells MCij (i and j are integers) arranged in a matrix. The bit lines BL are connected to drains of the memory cells MC arranged in a column direction serving as a first direction in the memory cell array MCA. The word lines WL are connected to gates of the memory cells MC arranged in a row direction that crosses the column direction and serves as a second direction in the memory cell array MCA. The sense amplifier SAi is provided for every bit line pair BLi and bBLi (i is an integer) and detects information data transmitted to, e.g., a first bit line BLi based on reference data transmitted to a second bit line bBLi. In contrast, the sense amplifier SAi can detect information data transmitted to the second bit line bBLi based on reference data transmitted to the first bit line BLi.

The sense amplifier SAi has a sense node pair SBLi and bSBLi and latches the detected information data at the sense node pair SBLi and bSBLi. The sense nodes SBLi and bSBLi hold data with the opposite logic to each other.

The paired sense nodes SBLi and bSBLi are connected via column selective transistors TCSL(2i), and TCSL(2i+1) to the DQ lines DQ and bDQ, respectively. The DQ lines DQ and bDQ are connected to the output circuit 10. To read externally data from the memory device, a column to be read is selected. The selected column selective line CSLi drives the column selective transistors TCSL(2i) and TCSL(2i+1). The column selective transistors TCSL(2i) and TCSL(2i+1) thus become conductive to transmit the data latched by the sense amplifier SAi to the output circuit 10. The output circuit 10 includes an I/O circuit to output the data externally from the memory device.

Further, the paired sense nodes SBLi and bSBLi are further connected to gates of the transistors NRLi and NRRi, respectively. The transistor NRLi is connected between the first voltage source Vss and the first determination node RL. The transistor NRRi is connected between the first voltage source Vss and the second determination node RR.

The first determination node RL and the second determination node RR are connected via P-type transistors PRL and PRR to the second voltage source Vdd. Gates of the transistors PRL and PRR receive test signals TR that become active at low level potential during tests. The transistors PRL and PRR are non-conductive during a usual operation (during a data read/write operation) and become conductive at the time of test. The data determination circuit 20 is also not active during the usual operation.

When any of the transistors NRL0 to NRLn−1 is conductive in tests, the first determination node RL has a potential Vss. When all of the transistors NRL0 to NRLn−1 are non-conductive, the first determination node RL has a potential Vdd. When any of the transistors NRR0 to NRRn−1 is conductive in tests, the second determination node RR has the potential Vss. When all of the transistors NRR0 to NRRn−1 are non-conductive, the second determination node RR has the potential Vdd. Sizes of the transistors NRLi, NRRi, PRL, and PRR are set so that the first and second determination nodes RL and RR are driven as described above. To realize the setting, the size (W (gate width)/L (gate length)) of the transistors NRLi and NRRi needs to be at least larger than that of the transistors PRL and PRR.

The first and second determination nodes RL and RR are connected to the data determination circuit 20. The data determination circuit 20 detects the maximum value (or the minimum value) in the voltage distribution of data "0" and the maximum value (or the minimum value) in the voltage distribution of data "1" based on the logic transition of the first and second determination nodes RL and RR. That is, the data determination circuit 20 detects the maximum value (or the minimum value) of 0 cell's threshold voltage and the minimum value (or the maximum value) of 1 cell's threshold voltage.

Figures 2A, 2B:
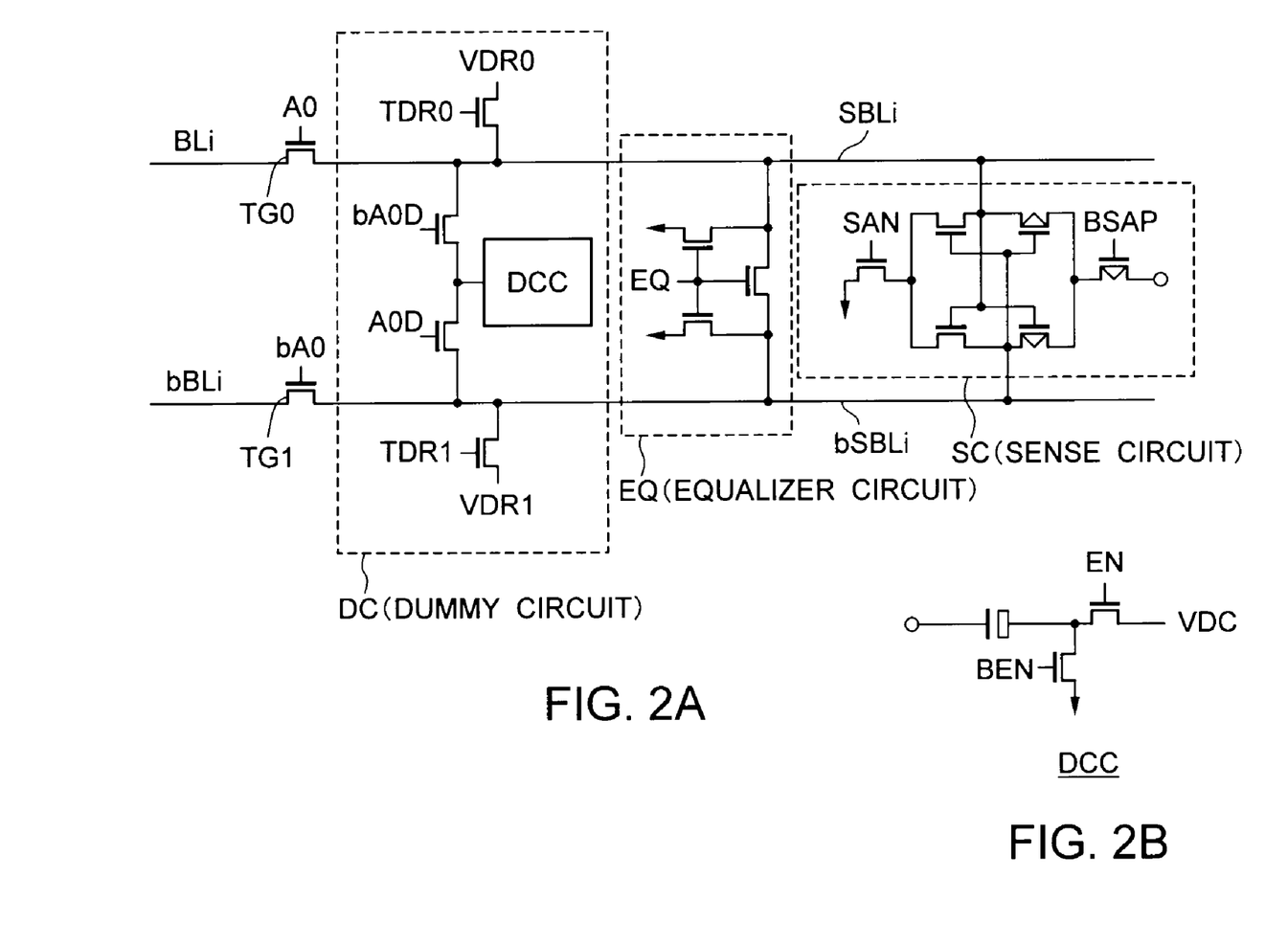
FIGS. 2A and 2B are circuit diagrams of configurations of the sense amplifier SA and a dummy cell DC.

FIGS. 2A and 2B are circuit diagrams of configurations of the sense amplifier SA and a dummy cell DC. The sense nodes SBLi and bSBLi are connected via transfer gates TG0 and TG1 to the bit lines BLi and bBLi, respectively. Signals A0 and bA0 are complementary to each other when the sense amplifier SA is operated. Thus, the transfer gate TG0 or TG1 connects the sense node SBLi or bSBLi to the bit line BLi or bBLi when the sense amplifier SA detects data. Connected to the sense nodes SBLi and bSBLi are a dummy circuit DC, an equalizer circuit EQ, and a sense circuit SC.

The dummy circuit DC applies the reference voltage to the bit line BLi or bBLi. Signals A0D and bA0D are complementary to each other when the sense amplifier SA is operated. For example, when A0 is high level, bA0 and bA0D are low level and A0D is high level. Thus, the sense node SBLi is connected to the bit line BLi and the sense node bSBLi is connected to a dummy core circuit DCC. As a result, the information data read from memory cells is transmitted to the sense node SBLi. Reference data is transmitted to the sense node bSBLi. The sense circuit SC amplifies the potential difference between the information data and the reference data. The data with the opposite logic are amplified at the sense nodes SBLi and bSBLi.

When the sense amplifier SA is in a standby state, i.e., does not perform detection, the signals A0, bA0, A0D, and bA0D are low level. The transfer gates TG0 and TG1 are thus switched off. At this time, the equalizer circuit EQ is operated to equalize the sense nodes SBLi and bSBLi so as to have the ground potential.

As described above, the sense amplifier SA equalizes the sense nodes SBLi and bSBLi so as to have the ground potential during standby. During data read, a potential depending on cell information is applied to the sense node SBLi or bSBLi and the reference potential is applied to the other. They are amplified by the sense amplifier, so that cell data is outputted.

The configuration of the sense amplifier SA is not restricted to the one shown in FIG. 2 and other known sense amplifiers can be used. b indicates signals with the opposite logic to  or signal lines for transmitting the signals with the opposite logic to **.

A measurement operation (a test operation) for determining cell information according to the first embodiment will be described. In the measurement operation, a test signal TR becomes active and the transistors PRL and PRR are switched on. Because the sense nodes SBL and bSBL are equalized to be the ground before the sense amplifier SA is operated, the transistors NRL and NRR are switched off.

Assume that the potential of a bit line or a sense node transmitting data "0" is lower than that of the one transmitting data "1" in the first embodiment. Naturally, the potential relationship between the data "0" and the data "1" can be reversed.

[Determination of Maximum Value of 0 Cells' Signal Amount]

A word line WLj (j is an integer) is selected first and data "0" is written in memory cells MCj0 to MCj($2n+1$) in all columns connected to the selected word line WLj. Sense amplifiers SA in all columns apply reference data (reference potential) to bit lines bBL and the data of the memory cells MCj0 to MCj($2n+1$) connected to the bit lines BL are detected. At first, the potential of the reference data is set to low level so as to be much lower than the potential of the data "0" in all columns. The information data of the memory cells MCj0 to MCj($2n+1$) is detected and cell information is determined every time when the potential of the reference data is subsequently stepped up from the low level potential by a certain voltage.

When the potential of the reference data is sufficiently low level, the potential of information data of the bit line BLi is much higher than that of the bit line bBLi. At this time, sense nodes SBL in all columns become high level while sense nodes bSBL in all columns low level. Thus, the first determination node RL becomes low level (Vss), while the second determination node RR high level (Vdd). The actual threshold voltages of the memory cells MCj0 to MCj($2n+1$) vary to a certain extent. Accordingly, when the potential of the reference data is increased gradually, a bit line BL whose potential is lower than that of the reference data appears from the bit lines BL and the number of the bit line BL with lower potential is increased gradually. When the potentials of the bit lines BL in all columns are lower than that of the reference data, the first determination node RL becomes high level (Vdd). That is, if at least one bit line BL whose potential is higher than that of the reference data appears, the first determination node RL maintains low level (Vss). When the potentials of the bit lines BL in all columns are lower than that of the reference data, however, the first determination node RL is inverted to high level (Vdd).

As described above, the data determination circuit 20 detects the potential of the first determination node at the time when the logic of the information data detected by all sense amplifiers SA in all columns is inverted. The potential of the reference data when the potential of the first determination node RL is inverted is the maximum value of the signal amount for the memory cells MCj0 to MCj($2n+1$) storing the data "0".

[Determination of Minimum Value of 1 Cells' Signal Amount]

A word line WLj (j is an integer) is selected and data "1" is written in memory cells MCj0 to MCj($2n+1$) in all columns connected to the selected word line WLj. Sense amplifiers SA in all columns detect the data of the memory cells MCj0 to MCj($2n+1$). At first, the potential of the reference data is set to sufficiently low level so as to be lower than the potential of the data "1" in all columns. The sense amplifier SA detects the information data of the memory cells MCji and determines cell information every time when the potential of the reference data is stepped up by a certain voltage.

When the potential of the reference data is sufficiently low, the potential of information data of the bit line BLi is much higher than that of the bit line bBLi. At this time, sense nodes SBL in all columns become high level, while sense nodes bSBL in all columns low level. The first determination node RL thus becomes low level (Vss), while the second determination node RR high level (Vdd). The actual threshold voltages of the memory cells MCj0 to MCj($2n+1$) vary to a certain extent. When the potential of the reference data is increased gradually, a bit line BL whose potential is lower than that of the reference data appears from the bit lines BL. When the potential of the bit line BLi in a column is lower than that of the reference data, the potentials of the bit line bBLi and the sense node bSBLi in that column are inverted from low level to high level. Thus, among transistors NRR0 to NRRn−1, the transistor NRRi in that column is switched on and the second determination node RR becomes low level (Vss). That is, when the potentials of the bit lines BL in all columns are higher than that of the reference data, the second determination node RR maintains high level (Vdd). When at least one bit line BL whose potential is lower than that of the reference data appears, however, the second determination node RR is inverted to low level (Vss).

As described above, the data determination circuit 20 detects the potential of the second determination node RR at the time when the logic of the information data detected by one of the sense amplifiers SA is inverted. The potential of the reference data when the potential of the second determination node RR is inverted becomes the minimum value of the signal amount for the memory cells MCj0 to MCj($2n+1$) storing the data "1".

The determination method described above is performed subsequently upon all of the word lines WL0 to WLm. As a result, the maximum value of 0 cells' signal amount and the minimum value of 1 cells' signal amount in the entire memory cell array MCA are determined.

Figure 3:
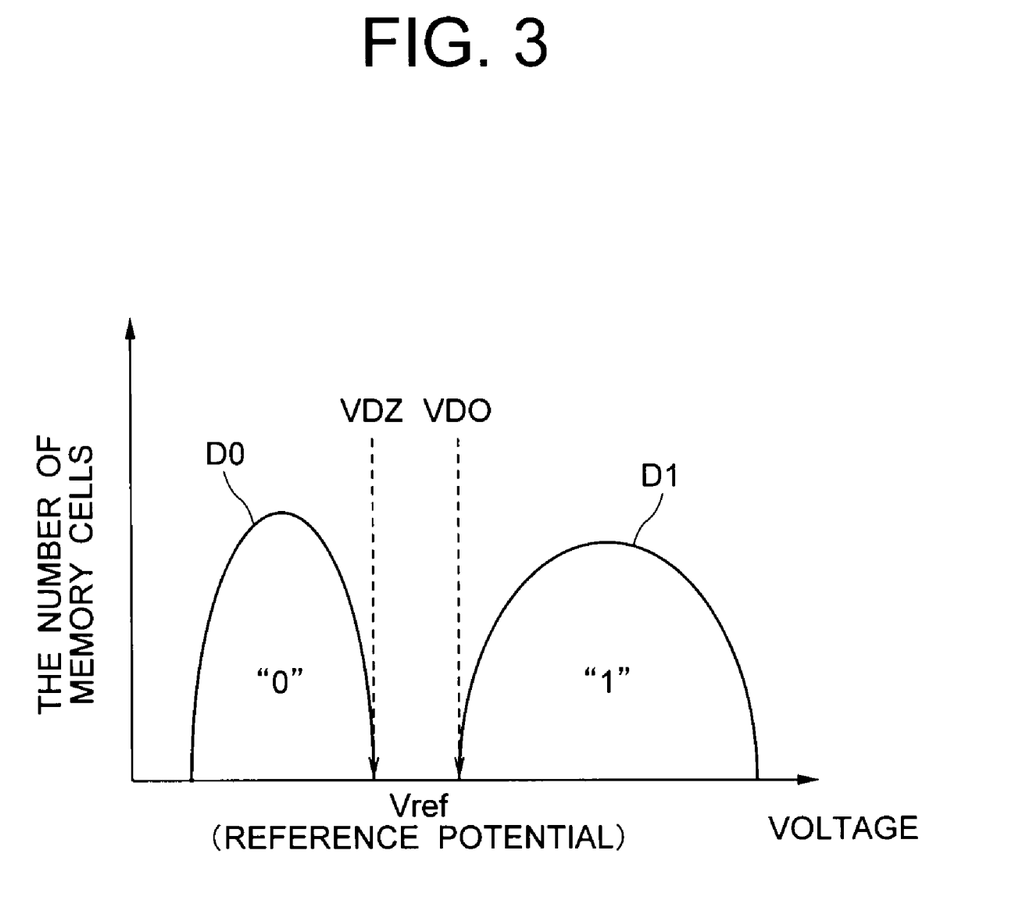
FIG. 3 is a graph showing the maximum value of 0 cells' signal amount, the minimum value of 1 cells' signal amount, and a reference potential Vref of the reference data.

FIG. 3 is a graph showing the maximum value of 0 cells' signal amount, the minimum value of 1 cells' signal amount, and a reference potential Vref of the reference data (reference voltage). With reference to FIG. 3, the vertical axis indicates the number of memory cells, while the horizontal axis indicates voltage. Distribution D0 indicates the voltage distribution of 0 cells' signal amount, while distribution D1 indicates the voltage distribution of 1 cells' signal amount. According to the first embodiment, the maximum value VDZ of the distribution D0 and the minimum value VDO of the distribution D1 are determined from the results of the above measurement. The reference voltage Vref is set to any potential between the maximum value VDZ and the minimum value VDO based on them. For example, the reference voltage Vref can be set to be the intermediate value between the maximum value VDZ and the minimum value VDO. The data potential or the signal amount mentioned herein indicates the potential of bit lines BL transmitting data or sense nodes SBL holding data.

The method for determining the maximum value for 0 cells and the minimum value for 1 cells among the cells connected to the bit line BLi has been described. To determine the maximum value for 0 cells and the minimum value for 1 cells among the cells connected to the bit line bBLi, the state of the first determination node and the state of the second determination node are interchanged.

While the method for determining cell information while changing the potential of reference data from low to high has been described, the cell information can be determined while changing the potential of the reference data from high to low.

In the first embodiment, the memory cells MCj0 to MCj (2n+1) in all columns connected to a word line WLj are tested at the same time to obtain the maximum and minimum values of the signal amount. Although the entire distribution of the signal amount cannot be obtained in the first embodiment, the maximum and minimum values of the distribution can be obtained in a short time.

Conventional memory devices read memory cells in all columns from the output circuit 10 in the order of their column addresses for one reference voltage set for measuring the signal amount. Accordingly, the signal amount cannot be measured simultaneously upon the memory cells in all columns.

Meanwhile, according to the first embodiment, memory cells in all columns can be determined simultaneously in the data determination circuit without reading data externally through the output circuit 10. Thus, the sense amplifier SA does not need to be selected in the order of column addresses to read data. The time for determining the maximum and minimum values of the signal amount can be reduced as compared to conventional cases. For example, if 256 word lines and 128 bit lines are provided in a memory cell array, the determination time is reduced to about $\frac{1}{100}$.

Second Embodiment

Figure 4:
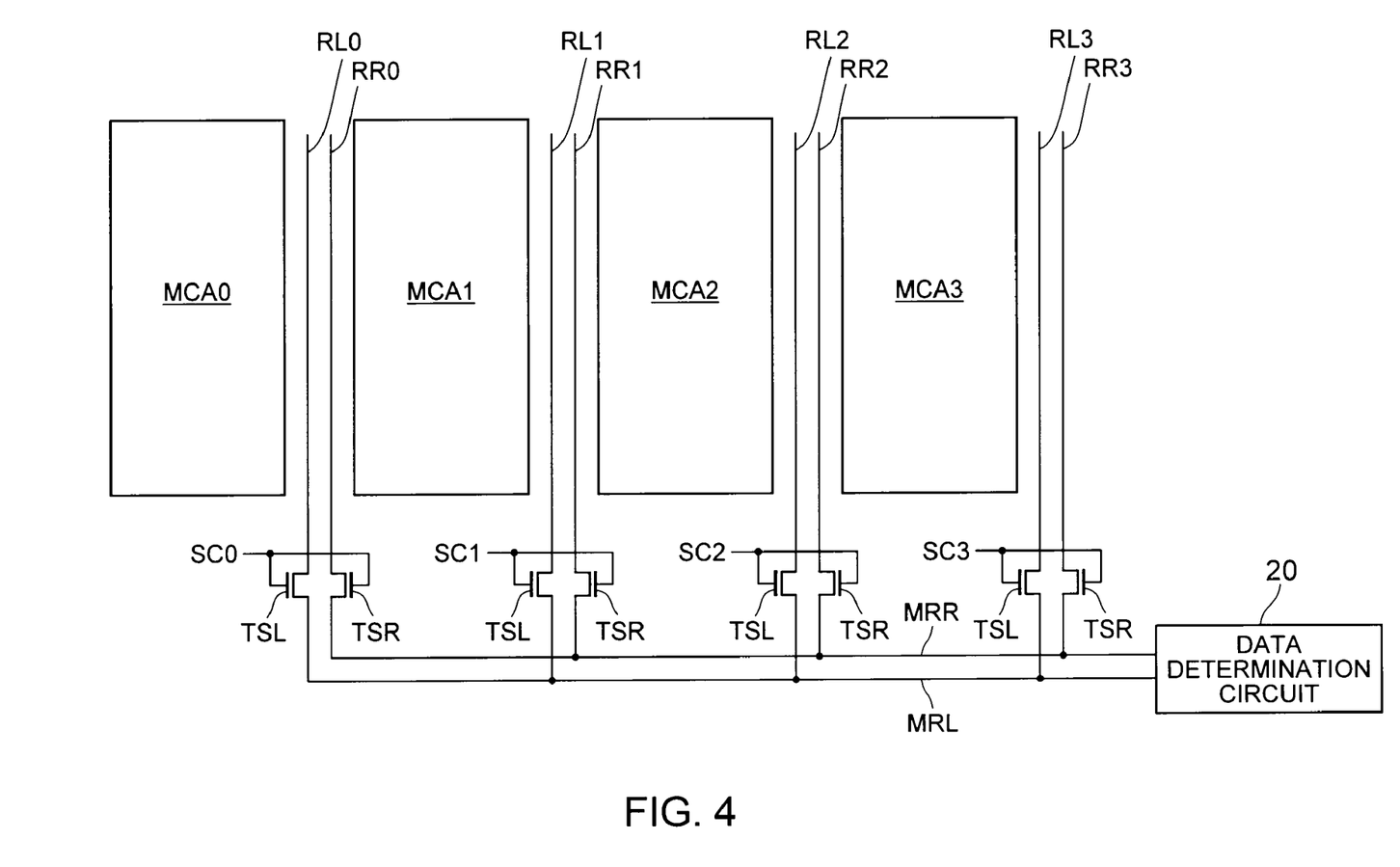
FIG. 4 is a block diagram of a memory device according to a second embodiment of the present invention.

FIG. 4 is a block diagram of a memory device according to a second embodiment of the present invention. In the second embodiment, the data determination circuit 20 is common to a plurality of memory cell arrays MCA0 to MCA3. The first determination node RL and the second determination node RR are provided to correspond to each of the memory cell arrays MCA0 to MCA3.

A first main node MRL and a second main node MRR are provided for the memory cell arrays MCA0 to MCA3. The first main node MRL is provided to be common to a plurality of the first determination nodes RL. The second main node MRR is provided to be common to a plurality of the second determination nodes RR.

A first selective transistor TSL and a second selective transistor TSR are provided for each of the respective memory cell arrays MCA0 to MCA3. Each first selective transistor TSL is connected between each of the first determination nodes RL and the first main node MRL. Each second selective transistor TSR is connected between each of the second determination nodes RR and the second main node MRR. The first selective transistors TSL and the second selective transistors TSR are controlled by selective signals SC0 to SC3. The selective signals SC0 to SC3 become active in the order of addresses of the memory cell arrays MCA0 to MCA3. The main nodes MRL and MRR are connected to the same data determination circuit 20.

The memory cell arrays MCA0 to MCA3 have the same configuration as that of the memory cell array MCA according to the first embodiment. Although not shown in FIG. 4, sense amplifiers SA, word lines WL, bit lines BL, sense nodes SBL and bSBL, DQ lines DQ and bDQ, an output circuit 10, first determination transistors NRL, second determination transistors NRR, and load transistors PRL and PRR in the second embodiment have the same configurations as in the first embodiment.

The signal amount of memory cells according to the second embodiment is measured by the same manner as in the first embodiment basically. In the second embodiment, however, the signal amount of memory cells is measured in the order of addresses of the memory cell arrays MCA0 to MCA3. For example, when a memory cell array MCA0 is selected, a selective signal SC0 becomes active. The data determination circuit 20 is then connected via the first and second main nodes MRL and MRR to the first and second determination nodes RL0 and RR0. The data determination circuit 20 can determine the maximum value of 0 cells' signal amount and the minimum value of 1 cells' signal amount in the memory cell array MCA0.

The data determination circuit 20 similarly performs measurement upon the memory cell arrays MCA1 to MCA3. The maximum and minimum values of the signal amount are thus determined for the memory cell arrays MCA0 to MCA3. Consequently, the reference potential can be set for each of the memory cell arrays MCA0 to MCA3.

The second embodiment can achieve the same effects as those of the first embodiment. Further, the data determination circuit 20, which is common to a plurality of memory cell arrays, is provided in the second embodiment. The size of the entire memory device is thus relatively small.

Third Embodiment

Figure 5:
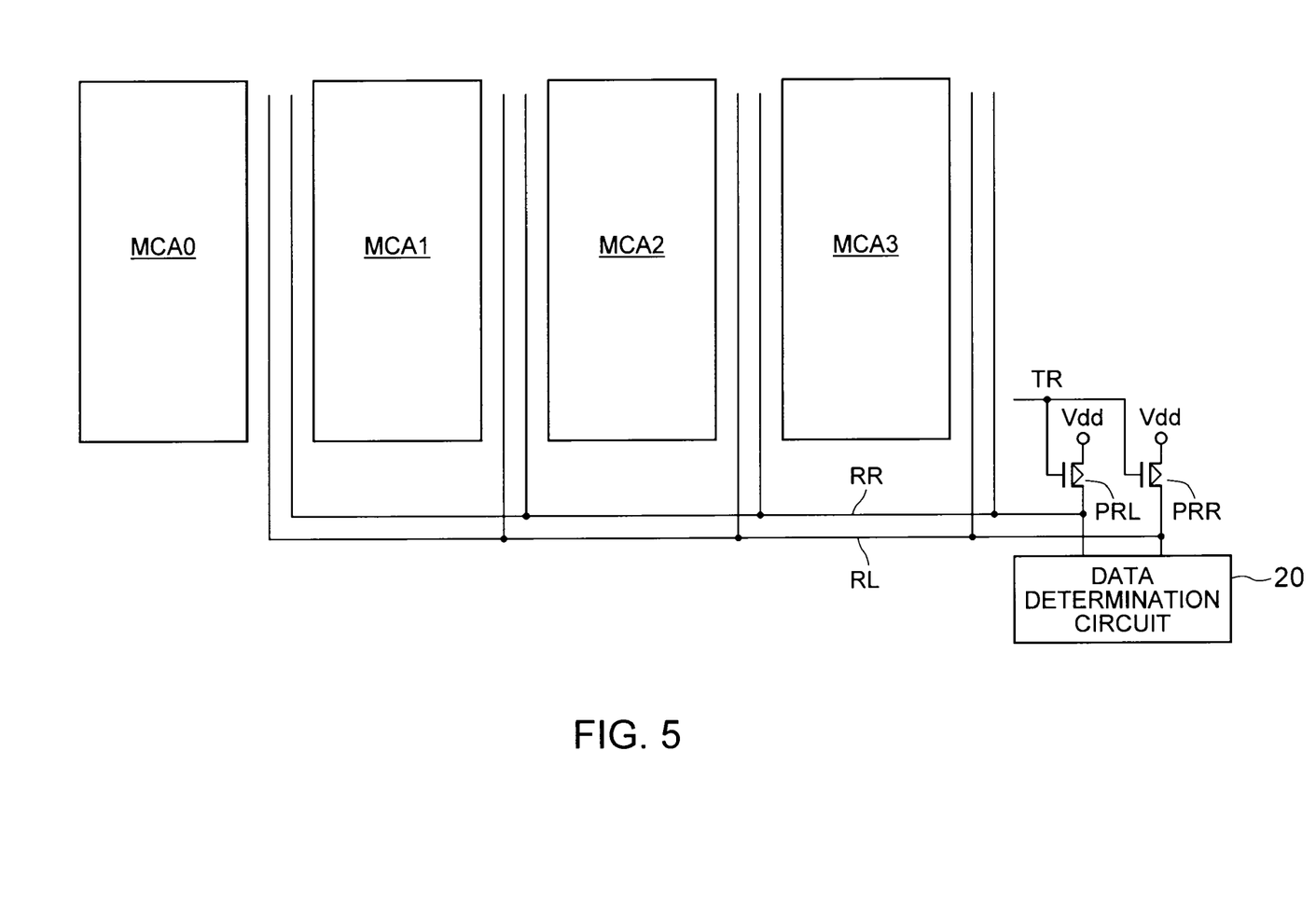
FIG. 5 is a block diagram of a memory device according to a third embodiment of the present invention.

FIG. 5 is a block diagram of a memory device according to a third embodiment of the present invention. The third embodiment is the same as the second embodiment in that a plurality of memory cell arrays MCA0 to MCA3 share the same data determination circuit 20, but different from the second embodiment in that selective transistors TSL and TSR are not provided, and that load transistors PRL and PRR are common to the memory cell arrays MCA0 to MCA3. Other configurations of the third embodiment are the same as those of the second embodiment.

Although the operation of the third embodiment is basically the same as in the second embodiment, a first determination node RL and a second determination node RR are common to the memory cell arrays MCA0 to MCA3 in the third embodiment. Thus, the data determination circuit 20 measures the maximum and minimum values of the signal amount for all of the memory cell arrays MCA0 to MCA3 not for each of them. The reference voltage Vref is thus set to be common to all memory cell arrays MCA0 to MCA3.

The third embodiment can achieve the same effects as those of the second embodiment. Because the measurement operation can be performed simultaneously upon the memory cell arrays MCA0 to MCA3 in the third embodiment, the time for determining the maximum and minimum values of the signal amount is further reduced as compared to the second embodiment. In the third embodiment, the selective transistors TSL and TSR are not provided and the memory cell arrays MCA0 to MCA3 share the data determination circuit 20 and the load transistors PRL and PRR. Thus, the memory device according to the third embodiment can be downscaled.

Fourth Embodiment

Figure 6:
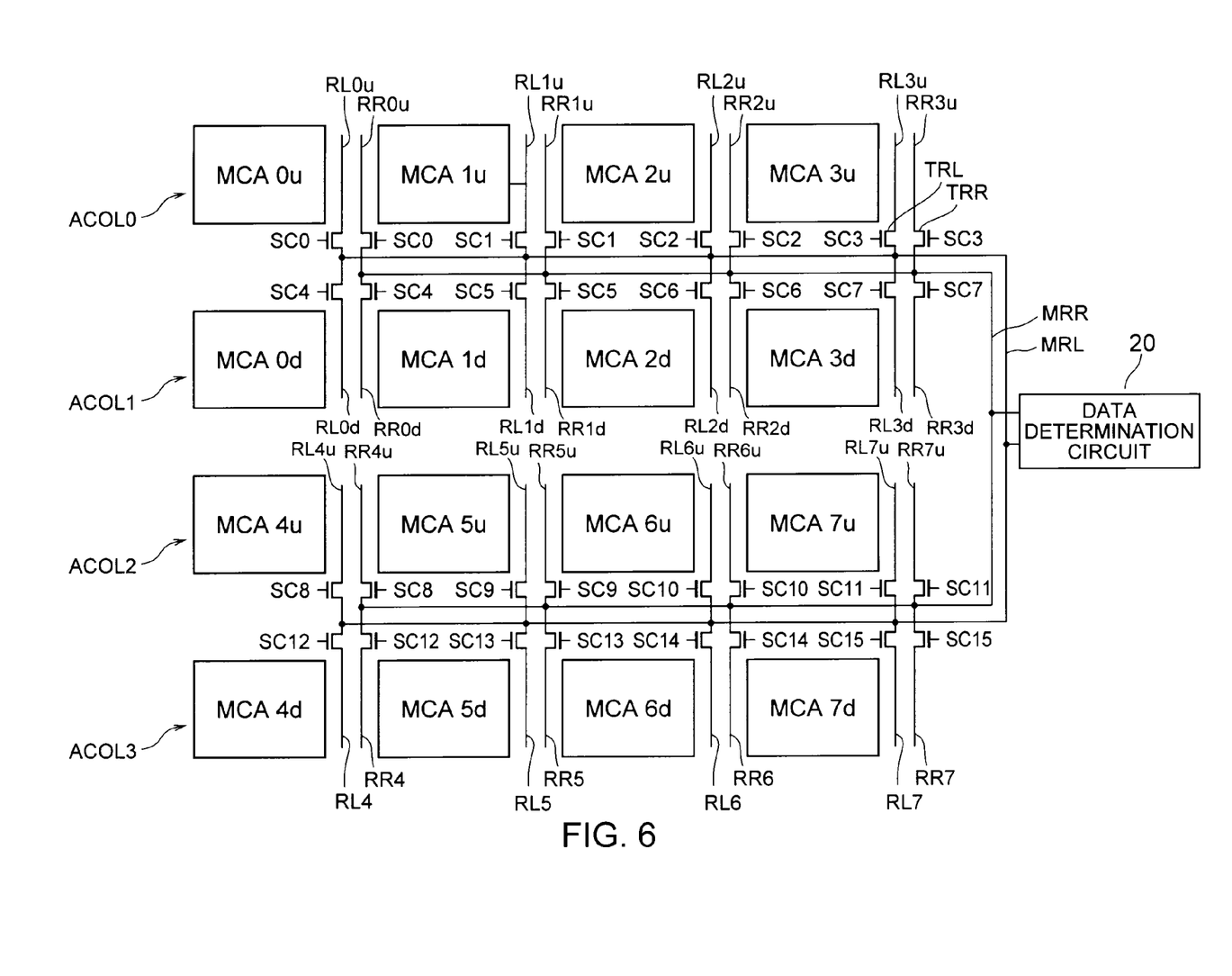
FIG. 6 is a block diagram of a memory device according to a fourth embodiment of the present invention.

FIG. 6 is a block diagram of a memory device according to a fourth embodiment of the present invention. The fourth embodiment is different from the second embodiment in that memory cell arrays are arranged in a matrix. Array columns ACOL0 to ACOL3 have the same configuration as that of the memory cell arrays MCA0 to MCA3 shown in FIG. 4. That is, when the memory cell arrays MCA0 to MCA3 of the second embodiment are assumed to be one array column, a plurality of the array columns are provided in the fourth embodiment.

Other configurations of the fourth embodiment are the same as those of the second embodiment.

Selective transistors TRL and TRR are provided for each of memory cell arrays MCA0u to MCA7u and MCA0d to MCA7d. The data determination circuit 20 is connected via the selective transistors TRL and TRR for the respective memory cell arrays to first and second determination nodes RL0u to RL7u, RL0d to RL7d, RR0u to RR7u, and RR0d to RR7d for the respective memory cell arrays. The operation of the fourth embodiment is basically the same as in the second embodiment. Each memory cell array is connected to the data determination circuit 20 according to its address. The reference voltage Vref is thus set for each of the memory cell arrays MCA0u to MCA7u and MCA0d to MCA7d. The fourth embodiment can achieve the same effects as those of the second embodiment.

Fifth Embodiment

Figure 7:
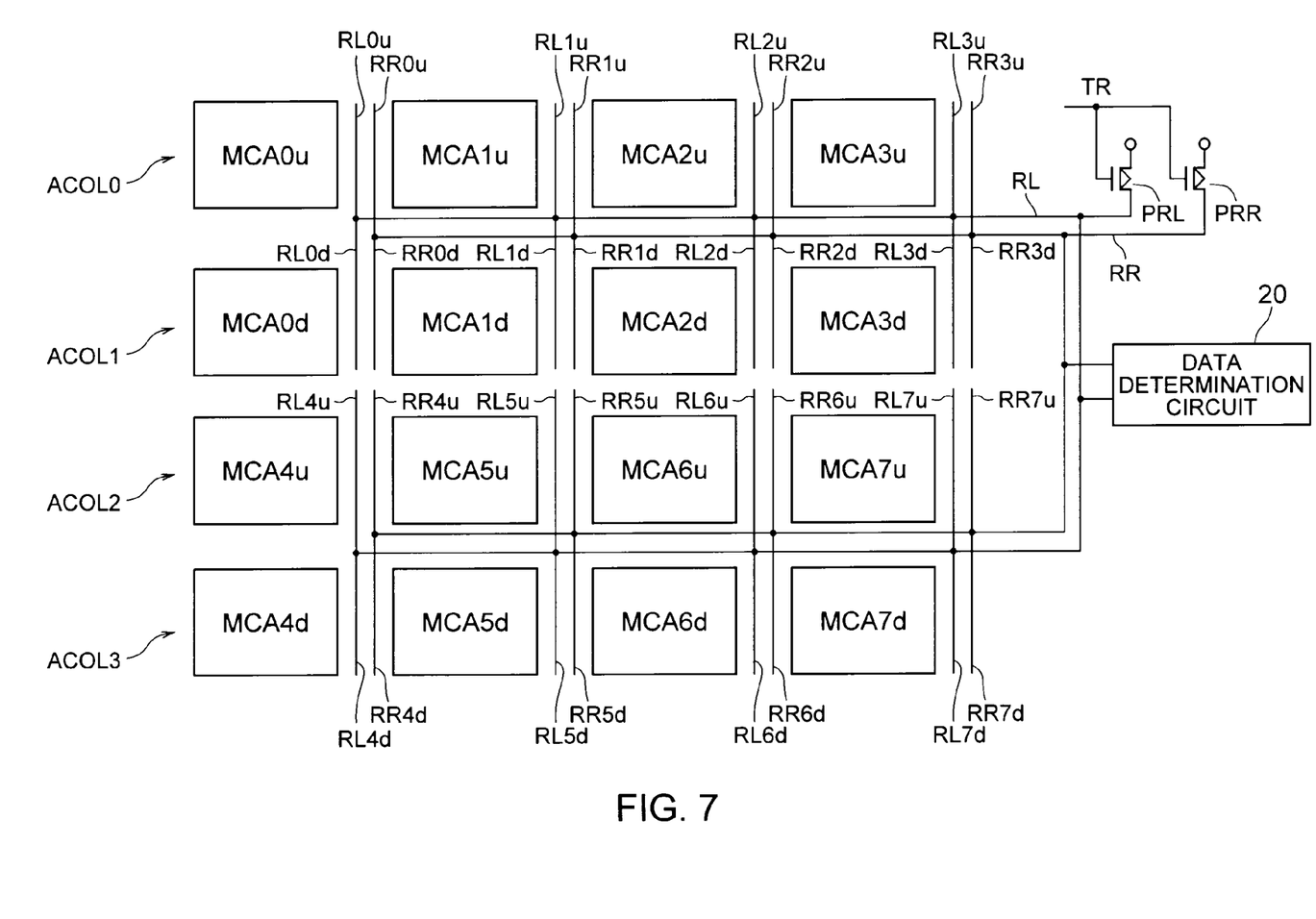
FIG. 7 is a block diagram of a memory device according to a fifth embodiment of the present invention.

FIG. 7 is a block diagram of a memory device according to a fifth embodiment of the present invention. The fifth embodiment is different from the third embodiment in that memory cell arrays are arranged in a matrix. Array columns ACOL0 to ACOL3 have the same configuration as that of the memory cell arrays MCA0 to MCA3 shown in FIG. 5. That is, when the memory cell arrays MCA0 to MCA3 of the third embodiment is considered to be one array column, a plurality of the array columns are provided in the fifth embodiment. Other configurations of the fifth embodiment are the same as those of the third embodiment.

The data determination circuit 20 is connected to first and second determination nodes RL0u to RL7u, RL0d to RL7d, RR0u to RR7u, and RR0d to RR7d for the respective memory cell arrays. The operation of the fifth embodiment is basically the same as in the third embodiment. That is, for measurement of the signal amount, all memory cell arrays MCA0u to MCA7u and MCA0d to MCA7d are connected simultaneously to the data determination circuit 20. The reference voltage Vref is thus set to be common to all memory cell arrays MCA0u to MCA7u and MCA0d to MCA7d. The fifth embodiment can achieve the same effects as those of the third embodiment.

Sixth Embodiment

Figure 8:
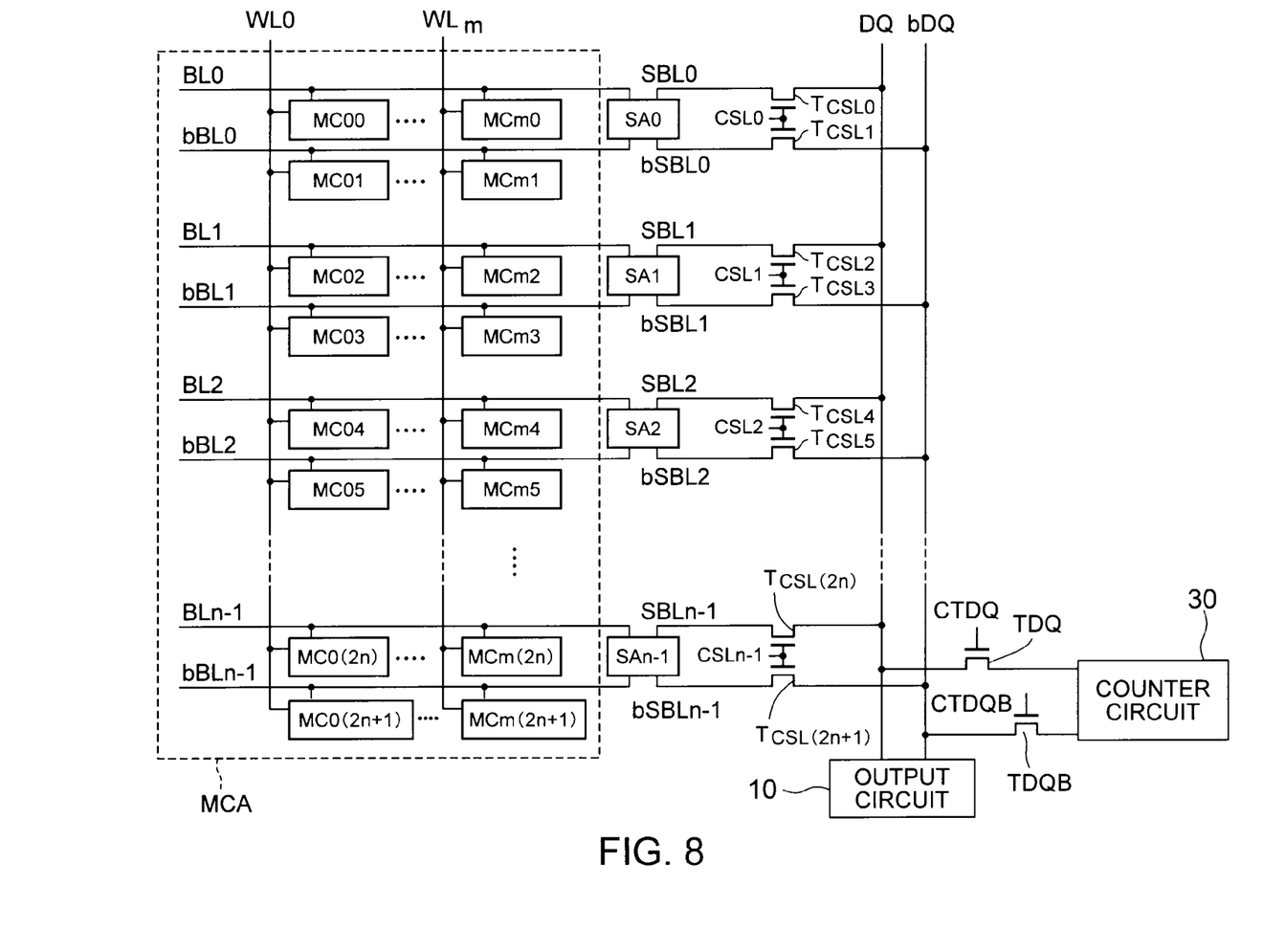
FIG. 8 is a block diagram of a memory device according to a sixth embodiment of the present invention.

FIG. 8 is a block diagram of a memory device according to a sixth embodiment of the present invention. In the sixth embodiment, the first and second determination nodes RL and RR, the first and second determination transistors NRL and NRR, the load transistors PRL and PRR, and the data determination circuit 20 are not provided. Instead, a counter circuit 30 connected via DQ transistors TDQ and TDQB to DQ lines DQ and bDQ serving as output nodes is provided. The DQ transistors TDQ and TDQB are switched on during measurement of the signal amount. Other configurations of the sixth embodiment are the same as those of the first embodiment.

The counter circuit 30 counts the number of cell information data when a potential is used as the reference data. In the sixth embodiment, data is not outputted externally from the output circuit 10. Instead, the counter circuit 30 counts the number of information data whose logic is inverted (number of bit lines' columns) through the DQ lines DQ and bDQ. To count the number of the bit lines' columns whose logic is inverted, a sense amplifier SA needs to be selected for every column address and the information data latched at a sense node needs to be transmitted to the counter circuit 30 in the memory device according to the sixth embodiment.

[Determination of Distribution of 0 Cells' Signal Amount]

A word line WLj (j is an integer) is selected first and data "0" is written in memory cells MCj0 to MCj(2n+1) in all columns connected to the selected word line WLj. Sense amplifiers SA in all columns apply a certain reference potential to bit lines bBL and detect the data of the memory cells MCj0 to MCj(2n+1) connected to bit lines BL. For determination of sense information, the information data of the memory cells MCj0 to MCj(2n+1) is detected every time when the potential of the reference data is stepped up from a low level potential by a certain voltage.

When the potential of the reference data is sufficiently low level, the potential of information data of the bit line BLi is much higher than that of the bit line bBLi. At this time, sense nodes SBL in all columns become high level, while sense nodes bSBL in all columns low level.

Column selective lines CSL0 to CSLn−1 are selected in the order of column addresses and the sense nodes SBL and bSBL in each column are connected to the DQ lines DQ and bDQ in the order of column addresses. The data latched at the sense nodes SBL and bSBL in each column is thus transmitted to the counter circuit 30. Consequently, the counter circuit 30 can count the information data whose logic is inverted. At first, the sense nodes SBL in all columns are high level, the sense nodes bSBL in all columns are low level, and the logic of any columns' data is not inverted. A count value in the counter circuit 30 is thus zero.

When the potential of the reference data is increased subsequently, a bit line BL whose potential is lower than that of the reference data appears from the bit lines BL. When the potential of a bit line BLi in a column is lower than that of the reference data, the potentials of the bit line bBLi and the sense node bSBLi in that column are inverted from low level to high level. The counter circuit 30 thus increases the count value by 1.

Further, when the potential of the reference data is further increased, the number of the bit lines BL whose potential is lower than that of the reference data is also increased. The count value of the counter circuit 30 is increased accordingly. When the potentials of information data of the bit lines BL in all columns become lower than that of the reference data, the logic of the data at the sense nodes SBL and bSBL in all columns is inverted. At this time, the count value of the counter circuit 30 is equal to the number of columns.

[Determination of Distribution of 1 Cells' Signal Amount]

A word line WLj (j is an integer) is selected and data "1" is written in memory cells MCj0 to MCj(2n+1) in all columns connected to the selected word line WLj. Sense amplifiers SA in all columns then apply a certain reference potential to bit lines bBL and detect the data of the memory cells MCj0 to MCj(2n+1) connected to bit lines BL. For determination of sense information, the information data of the memory cells MCji is detected every time when the potential of the reference data is stepped up by a certain voltage.

When the potential of the reference data is sufficiently low, the potential of information data of the bit line BLi is much higher than that of the bit line bBLi. At this time, sense nodes SBL in all columns become high level, while sense nodes bSBL in all columns low level.

Column selective lines CSL0 to CSLn−1 are selected in the order of column addresses and the sense nodes SBL and bSBL in each column are connected to DQ lines DQ and bDQ in the order of column addresses. The data latched at the sense nodes SBL and bSBL in each column is thus transmitted to the counter circuit 30. The counter circuit 30 can count the information data whose logic is inverted. At first, the sense nodes SBL in all columns are high level and the sense nodes bSBL in all columns are low level. The count value in the counter circuit 30 is thus zero.

When the potential of the reference data is increased subsequently, a bit line BL whose potential is lower than that of the reference data appears from the bit lines BL. When the potential of a bit line BLi in a column is lower than that of the reference data, the potentials of the bit line bBLi and the sense node bSBLi in that column are inverted from low level to high level. The counter circuit 30 thus increases the count value by 1.

When the potential of the reference data is further increased, the number of the bit lines BL whose potential is lower than that of the reference data is also further increased. The count value of the counter circuit 30 is increased accordingly. When the potentials of information data of the bit lines BL in all columns are lower than that of the reference data, the logic of the data at the sense nodes SBL and bSBL in all columns is inverted. The count value of the counter circuit 30 is thus equal to the number of columns.

Figure 9:
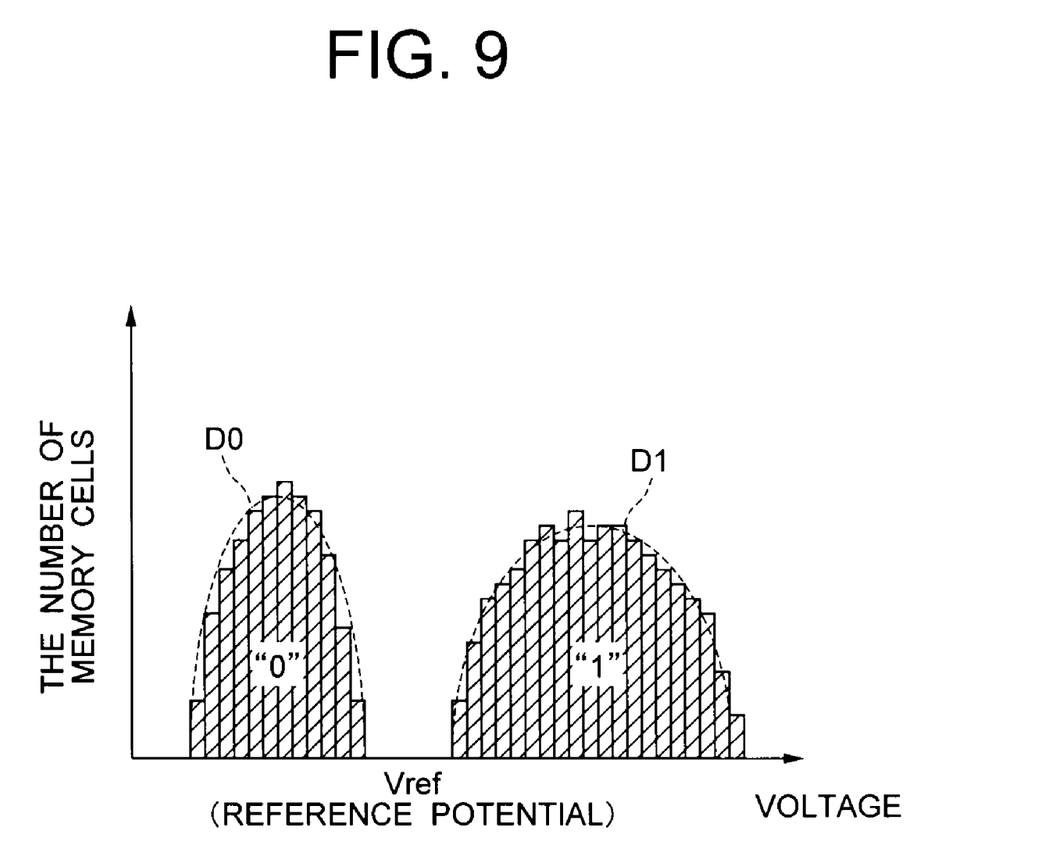
FIG. 9 is a graph showing voltage distributions of 0 cells' signal region and 1 cells' signal region.

As described above, the counter circuit 30 counts the number of data whose logic is inverted. Thus, as shown in FIG. 9, the voltage distributions of 0 cells' signal region and 1 cells' signal region can be obtained as well as the maximum and minimum values of the signal amount. According to the sixth embodiment, the reference voltage Vref can be determined based on not only the maximum and minimum values of the signal amount but also the distribution of the signal amount. While the method for determining the distribution of cells connected to the bit line BLi has been described, the same method can be used for determining the distribution of cells connected to the bit line bBLi.

For measurement of the signal amount, a sense node or a sense amplifier needs to be selected for every column in the sixth embodiment. The time required for measuring the signal amount may be extended as compared to the above embodiments. However, unlike conventional measurement methods, the sixth embodiment does not need to output data externally from the output circuit 10. Further, the counter circuit 30 counts determinations of signals' logic digitally in the sixth embodiment. Consequently, the sixth embodiment can reduce the time for measuring the signal amount as compared to conventional memory devices. Further, because charge and discharge of the output circuit 10 with relatively large capacitance is not required in measurement of the signal amount, the sixth embodiment contributes to reductions in noise and consumption power.

Seventh Embodiment

Figure 10:
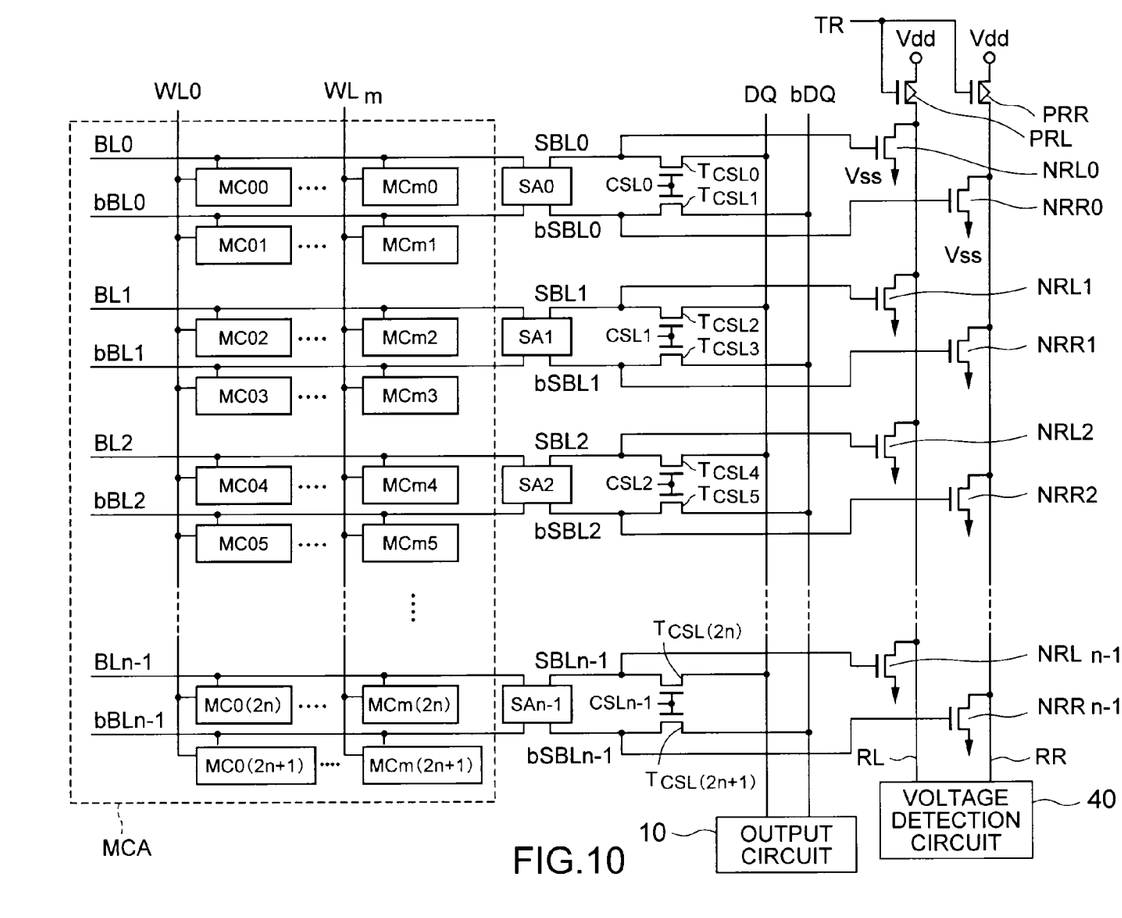
FIG. 10 is a block diagram of a memory device according to a seventh embodiment of the present invention.

FIG. 10 is a block diagram of a memory device according to a seventh embodiment of the present invention. In the seventh embodiment, a voltage detection circuit 40 is provided instead of the data determination circuit 20. Further, in the seventh embodiment, the size (W/L) of determination transistors NRL and NRR is smaller than that of load transistors PRL and PRR. Other configurations of the seventh embodiment are the same as those of the first embodiment.

The operation of the seventh embodiment is basically the same as in the first embodiment. According to the seventh embodiment, however, the voltage detection circuit 40 detects the potential of first and second determination nodes RL and RR analogously.

For example, when the potential of the reference data is sufficiently low, first determination transistors NRL are all switched on. The potential of the first determination node RL is thus the potential Vss of a first voltage source. When the potential of the first reference data is increased gradually and the number of bit lines BL whose potential is lower than that of the reference data is increased, the number of first determination transistors NRL switched off is increased. The potential of the first determination node RL is thus increased gradually from the potential Vss of the first voltage source. When the potentials of bit lines BL in all columns are lower than that of the reference data, all first determination transistors NRL are switched off. The potential of the first determination node RL thus becomes the potential Vdd of the second voltage source. During the above process, the potential of the second determination node RR operates in the opposite manner. That is, the potential of the second determination node RR is decreased from the potential Vdd of the second voltage source to the potential Vss of the first voltage source according to increases in potential of the reference data.

The voltage detection circuit 40 detects analogous changes in potential for the first and second determination nodes RL and RR. The distribution of the signal amount shown in FIG. 9 can thus be obtained. In the seventh embodiment, the voltage of the first determination node RL is inversely proportional to the number of switched on first determination transistors NRL. The voltage of the second determination node RR is inversely proportional to the number of switched on second determination transistors NRR.

According to the seventh embodiment, distributions of signal amounts in all columns connected to a word line can be measured at the same time. Like the first embodiment, the seventh embodiment can reduce the measurement time. The seventh embodiment can archive the effects of the first embodiment. Further, in the seventh embodiment, the distribution of the signal amount can be detected as well as the maximum and minimum values of the signal amount. Thus, the seventh embodiment can achieve the same effects as those of the sixth embodiment.

The above embodiments have described memory cells storing binary data. However, the present invention can be applied to memory cells storing multivalued data. In this case, three or more voltage distributions of information data and two or more reference voltages shown in FIG. 3 or 9 are provided. For measurement of the signal amount, measurements according to the above embodiments are performed upon two data whose voltage distribution is adjacent to each other among multivalued data. A reference potential can thus be set for the two data, and the remaining data is similarly processed. Thus, the above embodiments can be applied to a multivalued data memory.

The invention claimed is:

1. A semiconductor memory device comprising:
    a memory cell array comprising a plurality of memory cells arranged in a matrix;
    a plurality of bit lines connected to memory cells arranged in a first direction in the memory cell array;
    a plurality of word lines connected to the memory cells arranged in a second direction crossing the first direction in the memory cell array;
    a plurality of sense amplifiers detecting information data on the basis of reference data transmitted to a second bit line, the information data being transmitted to a first bit line among the bit lines;
    a plurality of first determination transistors receiving information data detected by the sense amplifiers at their gates and making a connection between a first voltage source and a first determination node be in a conductive state or a non-conductive state on the basis of a logic value of the information data;

a plurality of second determination transistors receiving the information data detected by the sense amplifiers at their gates and making a connection between the first voltage source and a second determination node be in a conductive state or a non-conductive state on the basis of the logic value of the information data;

a second voltage source charging the first and the second determination nodes; and a determination unit connected to the first and the second determination nodes and detecting potentials of the first determination node and the second determination node when a logic of the information data detected by the sense amplifiers is inverted from a first logic to a second logic or from the second logic to the first logic in order to determine maximum and minimum values of potential of the information data stored in the memory cells.

2. The device of claim 1, wherein the determination unit detects the potentials of the first determination node and the second determination node when a logic of all information data detected by the sense amplifiers is inverted from the first logic to the second logic or when a logic of one of the information data is inverted from the second logic to the first logic.

3. The device of claim 1, wherein a plurality of the memory cell arrays are provided, the first and the second determination nodes are provided for each of the memory cell arrays, and the determination unit is common to the memory cell arrays.

4. The device of claim 2, wherein a plurality of the memory cell arrays are provided, the first and the second determination nodes are provided for each of the memory cell arrays, and the determination unit is common to the memory cell arrays.

5. The device of claim 3 further comprising:

a first main node common to the first determination nodes;

a second main node common to the second determination nodes;

a plurality of first selective transistors connected between the first determination nodes and the first main node; and a plurality of second selective transistors connected between the second determination nodes and the second main node, wherein the first and the second selective transistors become conductive sequentially according to each of the memory cell arrays.

6. The device of claim 4 further comprising:

a first main node common to the first determination nodes;

a second main node common to the second determination nodes;

a plurality of first selective transistors connected between the first determination nodes and the first main node; and a plurality of second selective transistors connected between the second determination nodes and the second main node, wherein the first and the second selective transistors become conductive sequentially according to each of the memory cell arrays.

7. The device of claim 3 further comprising:

load transistors respectively connected between the first determination node and the second voltage source and between the second determination nodes and the second voltage source, wherein the load transistor is common to the memory cell arrays, and the determination unit determines maximum and minimum values of potential of the information data for the memory cell arrays.

8. The device of claim 4 further comprising:

load transistors respectively connected between the first determination node and the second voltage source and between the second determination nodes and the second voltage source, wherein the load transistor is common to the memory cell arrays, and the determination unit determines maximum and minimum values of potential of the information data for the memory cell arrays.

9. The device of claim 1 further comprising:

load transistors respectively connected between the first determination node and the second voltage source and between the second determination nodes and the second voltage source.

* * * * *